(12) United States Patent
Cox et al.

(10) Patent No.: US 6,788,386 B2
(45) Date of Patent: Sep. 7, 2004

(54) LITHOGRAPHIC APPARATUS AND DEVICE MANUFACTURING METHOD

(75) Inventors: Hendrikus Herman Marie Cox, Eindhoven (NL); Frank Auer, Eindhoven (NL); Marc Wilhelmus Maria Van Der Wijst, Veldhoven (NL); Bastiaan Stephanus Hendrikus Jansen, Loo (NL); Dominicus Jacobus Petrus Adrianus Franken, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/322,777

(22) Filed: Dec. 19, 2002

(65) Prior Publication Data

US 2003/0197914 A1 Oct. 23, 2003

(30) Foreign Application Priority Data

Dec. 21, 2001 (EP) .............................................. 01310781

(51) Int. Cl.[7] .......................... G03B 27/42; G03B 27/68

(52) U.S. Cl. ............................................. 355/53; 355/52
(58) Field of Search .............................. 355/53, 77, 52, 355/67, 55; 250/492.1, 492.2

(56) References Cited

U.S. PATENT DOCUMENTS

| 5,684,566 A | * 11/1997 | Stanton ........................ 355/67 |
| 5,823,307 A | * 10/1998 | Schubert et al. ............ 188/378 |
| 6,226,072 B1 | 5/2001 | Yabu |
| 2001/0015799 A1 | 8/2001 | Asano et al. |
| 2001/0026408 A1 | 10/2001 | Tanaka |
| 2002/0075574 A1 | * 6/2002 | Sorg et al. ................... 359/819 |
| 2002/0149754 A1 | * 10/2002 | Auer et al. ..................... 355/53 |

* cited by examiner

*Primary Examiner*—Russell Adams
*Assistant Examiner*—D. Ben Esplin
(74) *Attorney, Agent, or Firm*—Pillsbury Winthrop LLP

(57) ABSTRACT

A reaction mass and an actuator are used to reduce unwanted vibrations of an optical element in the projection system of a lithographic projection apparatus. The reaction mass may be mechanically connected only to the optical element or may be compliantly mounted to the projection system frame.

16 Claims, 5 Drawing Sheets

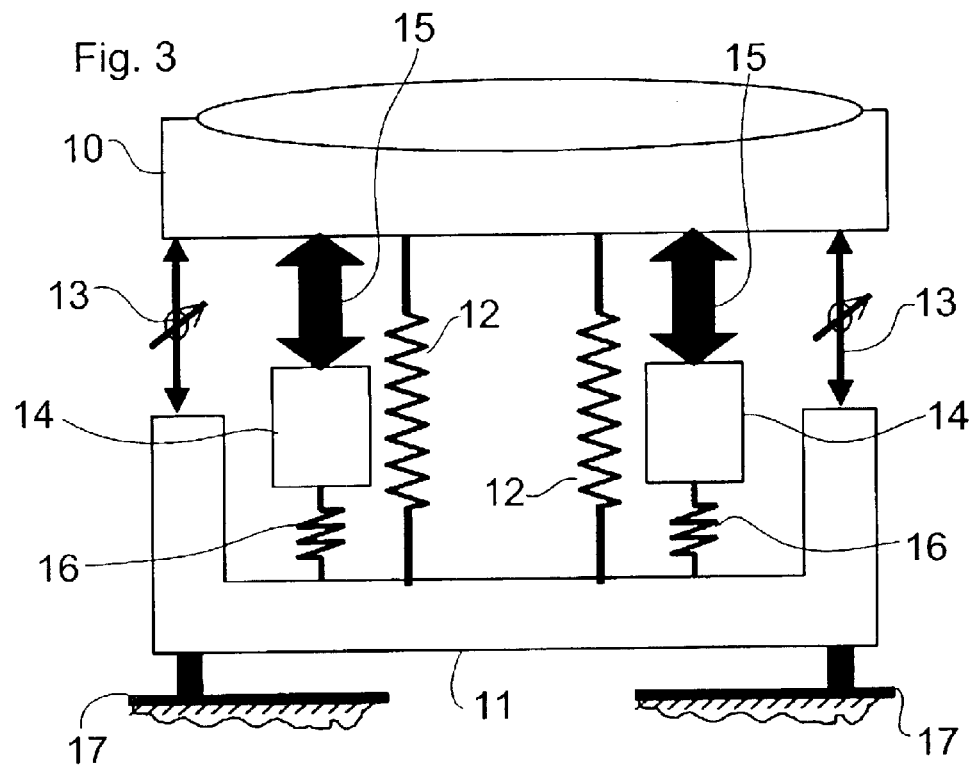
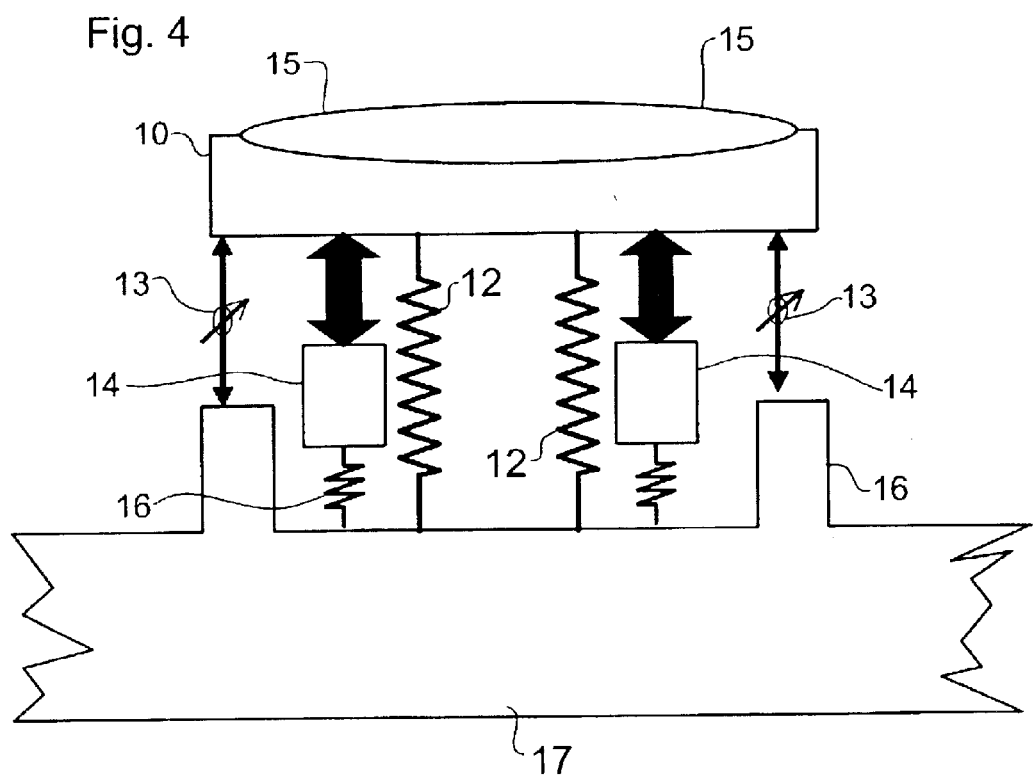

LITHOGRAPHIC APPARATUS AND DEVICE MANUFACTURING METHOD

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

For the sake of simplicity, the projection system may hereinafter be referred to as the "lens". However, this term should be broadly interpreted as encompassing various types of projection systems, including refractive optics, reflective optics, and catadioptric systems, for example. The radiation system may also include elements operating according to any of these design types for directing, shaping or controlling the projection beam of radiation, and such elements may also be referred to below, collectively or singularly, as a "lens" or as a "projection system element". The projection system of a lithographic apparatus such as that described above must project the patterned beam onto the target portion of the substrate with very high accuracy and without introducing errors such as optical aberration or displacement errors, for example, into the projected image. Refractive and/or reflective elements within the projection system may need to be accurately positioned in one or more (up to six) degrees of freedom per optical element (which may include, for example, linear displacement along three orthogonal axes and rotational displacement around the three axes). A projection system comprising reflective optics is, for instance, disclosed in U.S. Pat. Nos. 5,815,310 and 5,956,192.

The accuracy of the positioning of such projection system elements may be affected by vibrations and other positional noise within the projection system and the projection system frame. The positional noise may, for example, be created by influences external to the projection system (such as acoustic noise, residual floor vibrations and scan reaction forces transmitted via the vibration isolation or suspension system between the base frame and the projection optics system) and by internal influences such as the reaction forces of the actuators used to adjust the position of the projection system elements. The projection system elements may be mounted directly to a common frame of the projection system or may be mounted on a sub-frame that is mounted to the common frame. Further, the above considerations may also apply to the radiation system and projection system elements mounted therein.

SUMMARY OF THE INVENTION

It is an aspect of the present invention to reduce the effect of any disturbing forces and/or displacements within the projection or radiation system on the respective projection or radiation system elements mounted therein.

This and other objects are achieved according to the invention in a lithographic apparatus including a radiation system constructed and arranged to supply a projection beam of radiation; a support structure constructed and arranged to support a patterning device, the patterning device constructed and arranged to pattern the projection beam according to a desired pattern; a substrate table constructed and arranged to hold a substrate; and a projection system constructed and arranged to project the patterned beam onto a target portion of the substrate, wherein at least one of the projection and radiation systems comprises at least one optical element connected by an actuator to a reaction mass that is moveable in at least one degree of freedom, the force exerted by the actuator between the reaction mass and the optical element being used to control the position of the optical element in one or more degrees of freedom.

The present invention can thereby enable sub-nanometer position control of the transmissive and reflective optical elements in the optical (projection or radiation) system. This is done by a position control of one or more (up to six) degrees of freedom of the relative position of the optical element to the frame of the optical system. The greatly improved positional accuracy for the optical elements in the projection system or radiation system provides a corresponding improvement in imaging quality.

In an exemplary embodiment of the present invention, the reaction mass is compliantly mounted to a frame of the apparatus, such as a frame of the projection system, and the reaction to the force exerted by the actuator between the reaction mass and the optical element is used to move the optical element to the required position. This can prevent transmission of vibrations caused by the actuator when adjusting the position of the optical element to the remainder of the apparatus and thence to other optical elements. In addition it can prevent vibrations in the projection system or the radiation system, for example vibrations caused by sources external to the projection or radiation system from being transferred to the optical element.

In a further exemplary embodiment of the present invention, the reaction mass is connected only to the optical element and an accelerometer is used to detect the movement of the optical element. Using data from the accelerometer, the reaction to the force exerted by the actuator between the reaction mass and the optical element can be used to reduce the movement of the optical element. This can reduce any residual vibration in the optical element.

According to a further aspect of the invention there is provided a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material using a projection system, wherein an actuator is connected between a reaction mass that is moveable in at least one degree of freedom and an optical element in at least one of the projection and radiation systems; and using the force exerted by the actuator between the reaction mass and the optical element to control the position of the optical element.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which:

FIG. 3 depicts an optical element mounted via a sub-frame and two one-degree of freedom reaction masses to a projection system frame;

FIG. 4 depicts an optical element mounted via two 1-degree of freedom reaction masses to a projection system frame, without a sub-frame;

In the Figures, corresponding reference symbols indicate corresponding parts.

DETAILED DESCRIPTION

Figure 1:
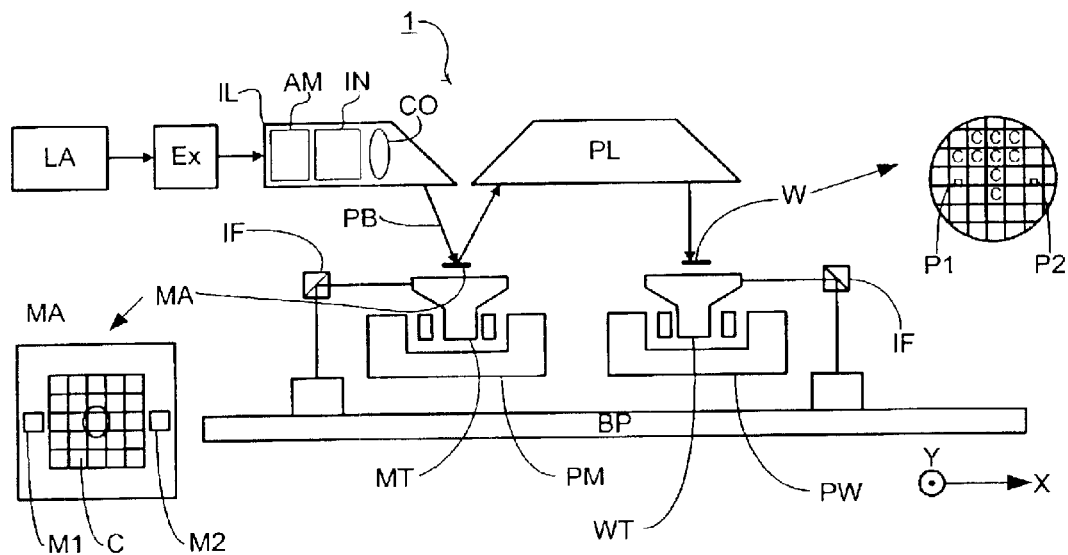
FIG. 1 depicts a lithographic projection apparatus according to a first embodiment of the invention.

FIG. 1 schematically depicts a lithographic projection apparatus 1 according to an embodiment of the invention. The apparatus 1 includes a base plate BP; a radiation system Ex, IL constructed and arranged to supply a projection beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometers IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
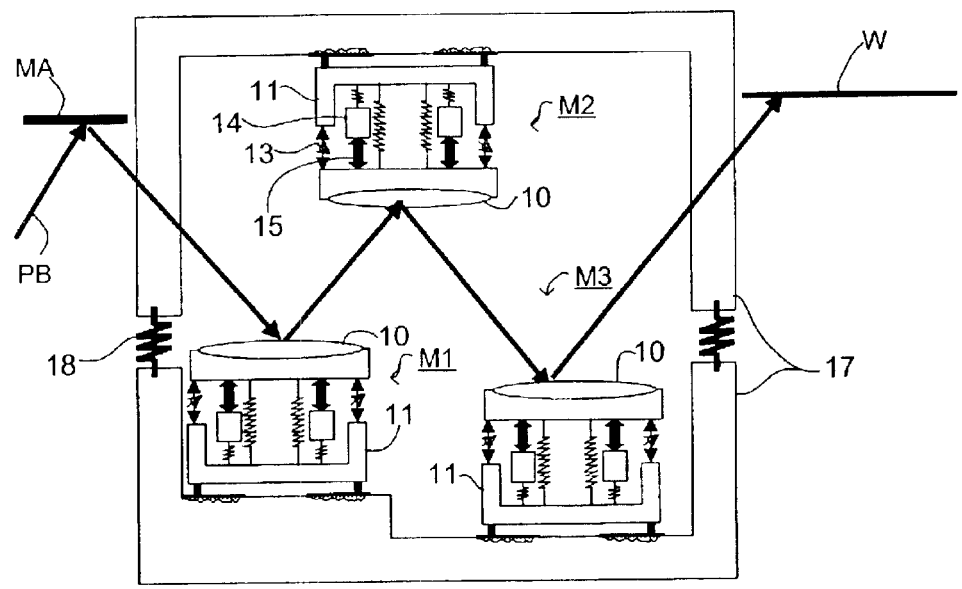
FIG. 2 depicts the projection system of the apparatus of FIG. 1 in greater detail.

The projection system is shown, by way of example, in FIG. 2 as three reflective optical elements mounted in an optical system frame. In an apparatus, the projection system may comprise more, e.g. four or six, reflectors each mounted in the manner shown in FIG. 2. The optical elements, in this case reflectors M1, M2, and M3, are mounted to a frame 17 via respective positioning systems that are preferably capable of positioning the optical elements (e.g. mirrors) 10 accurately in six degrees of freedom. For a sub-nanometer position accuracy the position loops that control each optical element must have a high servo bandwidth, which is physically limited by the mechanical eigenfrequencies seen in the servo loop. The optical element itself is relatively compact and has relatively simple mechanics, so the dynamics can be designed with high internal mechanical eigenfrequencies (e.g. >1000 Hz). The optical system frame 17, however, may contain several optical elements, is usually large and thus cannot have high internal mechanical eigenfrequencies (e.g. <<1000 Hz).

An actuator 15 drives the optical element 10 and excites the internal dynamics of it. A corresponding reaction (control) force directly put on the optical system frame 17 and/or optical system sub-frame 11 would excite the internal dynamics of the optical sub-frame 11 and of the optical system frame 17. Because the position of the element measured by servo 13 is the position of the optical element 10 with respect to the optical system sub-frame 11, this position measurement includes the dynamics of the optical element 10 and the dynamics of the optical system sub-frame 11 (if present) and optical system frame 17. The dynamics of the optical system frame 17 (symbolically shown by connection 18) will form a severe limit on the achievable servo-bandwidth and thus on the positioning accuracy of the optical element 10.

According to the invention, the difficult dynamics of the optical system frame 17 can be removed from the servo loop by introducing a reaction mass 14 between the reaction (control) force and the optical system sub-frame 11 (as shown in FIG. 3) or the optical system frame 17 (as shown in FIG. 4). With this arrangement, the eigenfrequency (typical 5–20 Hz) of the reaction mass 14 and resilient mounting member 16 forms a mechanical low-pass filter for the transmission of reaction force to the optical system frame 17. Reaction forces with frequencies below the reaction mass eigenfrequency are transmitted directly to the optical system frame 17. But all reaction forces above this frequency become low pass filtered (roll off=−40 dB/decade) and excite the optical system dynamics. The effect on control stability is that the servo loop does not contain the dynamics of the optical system frame 17 and sub-frame 11. The servo loop then can have a very high bandwidth because it only contains the high frequency dynamics of the optical element 10 and some small effects of the low frequency dynamics of the reaction mass 14 (typical at ca. 10 Hz) that do not form a problem for control stability. So a high servo bandwidth and thus positioning accuracy is possible, despite the low frequency dynamics of the optical system frame 17.

Two alternative arrangements for mounting optical elements are shown in greater detail in FIGS. 3 and 4.

FIG. 3 depicts a mount for a projection system element 10, such as a mirror, to fix it to the projection system frame 11 within the projection system PL via the sub-frame 11. The schematic system shown is capable of adjusting the position of the projection system element 10 in two degrees of freedom: linear displacement in a first direction (vertical as shown in FIG. 2) and rotational displacement about a second direction (perpendicular to the plane of FIG. 2), giving two degrees of freedom. More degrees of freedom will generally be required, up to six degrees of freedom (three translational and three rotational) for each mirror. Further the projection system PL will comprise several projection elements. Those degrees of freedom not shown in FIG. 2 may be reached in a corresponding manner with the appropriate modifications.

The projection system element 10 may be supported by gravity compensators 12 which may, for example, be mechanical springs as depicted in FIG. 3 or may be based on pneumatic principles, permanent magnets or other suitable device. The purpose of the gravity compensators 12 is to support the projection system element 10 against gravity, reducing the force to be exerted by the actuators 15 used to position the projection system element 10 and therefore their power dissipation. If the cooling of the vertical motors is sufficiently good, an additional gravity compensator is not required and gravity force can be compensated by motor force. The positioning actuators 15 are, preferably, Lorenz-force motors. The actuators 15 operate against reaction masses 14 which are compliantly mounted to the projection system frame 11 with the resilient mounting member (e.g. a spring) that has a low suspension frequency. Preferably the resonant frequency of the suspension of the reaction mass 14 will generally be in the range 0 to 100 Hz, for instance, of the order of 10 Hz. Such a mount may be referred to as a soft mount. The reaction mass 14 includes the magnet or, preferably, the motor coil of the Lorenz-force motor so that the heat source is away from the optical element 10. Further background on Lorenz-force motors and gravity compensation is, for instance, disclosed in EP 1,001,512 A.

Position sensors 13 are used to measure the position of the projection system element 10 relative to the sub-frame 11 or directly to the projection system frame 17. Depending on the requirements of the control system the position sensors 13 may be used to determine the relative displacement, velocity and accelerations of the projection system element 10.

In general the forces needed to position the optical element 10 are small, because the motion of the vibration isolated projection system frame 17 is small. Excitations of the projection system frame 17 by the reaction motor control force itself, however can create a stability problem for the closed loop controlled optical element 10. The application of the reaction mass 14 prevents the reaction force of the Lorenz-force motors 15 from disturbing the sub-frame 11 mounted on the projection system frame 17. In an alternative construction shown in FIG. 4, the sub-frame 11 is omitted and the resilient mounting member 16, gravity compensators 12 and sensors 13 are mounted on the projection system frame 17.

In effect the resilient mounting of the reaction mass 14 to the projection system frame 17 by the resilient mounting member 16 filters the reaction force of the Lorenz motor for frequencies above the eigenfrequency of the reaction mass 14. This eigenfrequency is determined by the mass of the reaction mass 14 and the stiffness of the resilient mounting member 16. The reaction force filtering in turn reduces the amount of positional noise in the sub-frame 11 that could be transmitted to the respective element 10 itself and to the other projection system elements attached to the projection system frame 17. Effectively the internal projection system dynamics becomes invisible to the position control loop of the projection system elements. The result is that the control stability of the control system for the projection system elements is much improved, especially at higher frequencies, i.e. there is a greatly reduced return path for actuator reaction forces to the projection system frame forming the reference for the position measurement. A control loop can therefore be designed with a very high positional bandwidth in the range 100 to 1000 Hz, for example approximately 300 Hz. This in turn means that the positional accuracy is greatly increased. The projection system element 10 may therefore be positioned to an accuracy below approximately 0.1 nm. The internal dynamics of the projection system PL are therefore not affected when actuating the projection system elements 10. Above the eigenfrequency of the softly mounted reaction mass 14, the projection system element(s) cannot excite the projection system dynamics as its (their) "dynamic mass" is (are) not felt by the projection system PL.

The control of the projection system element 10 is preferably effected by one or more control loops which may include and possibly combine both velocity and positional loops.

Figure 5:
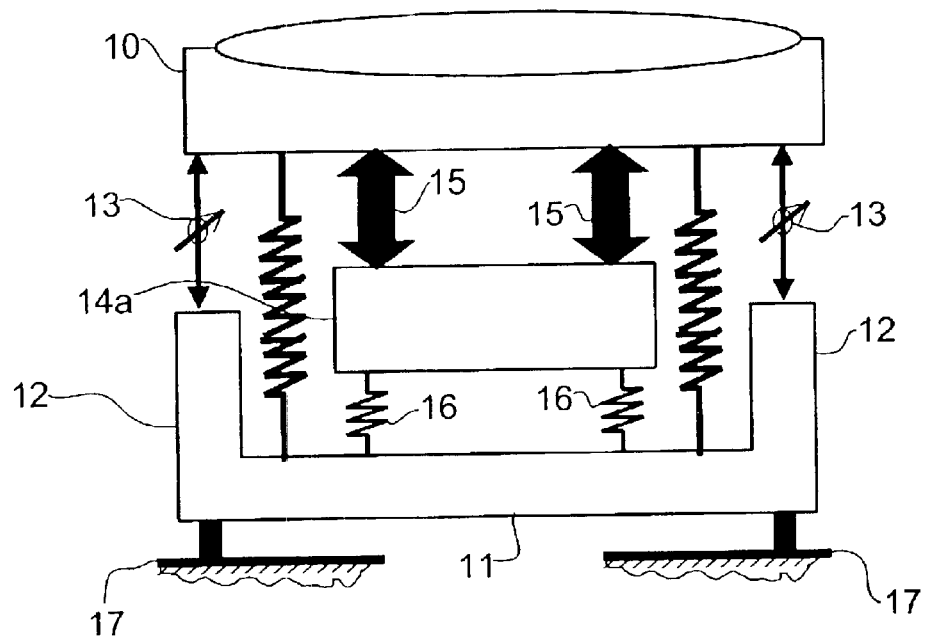
FIG. 5 depicts an optical element mounted via a sub-frame and a single two-degree of freedom reaction mass to a projection system frame.
Figure 6:
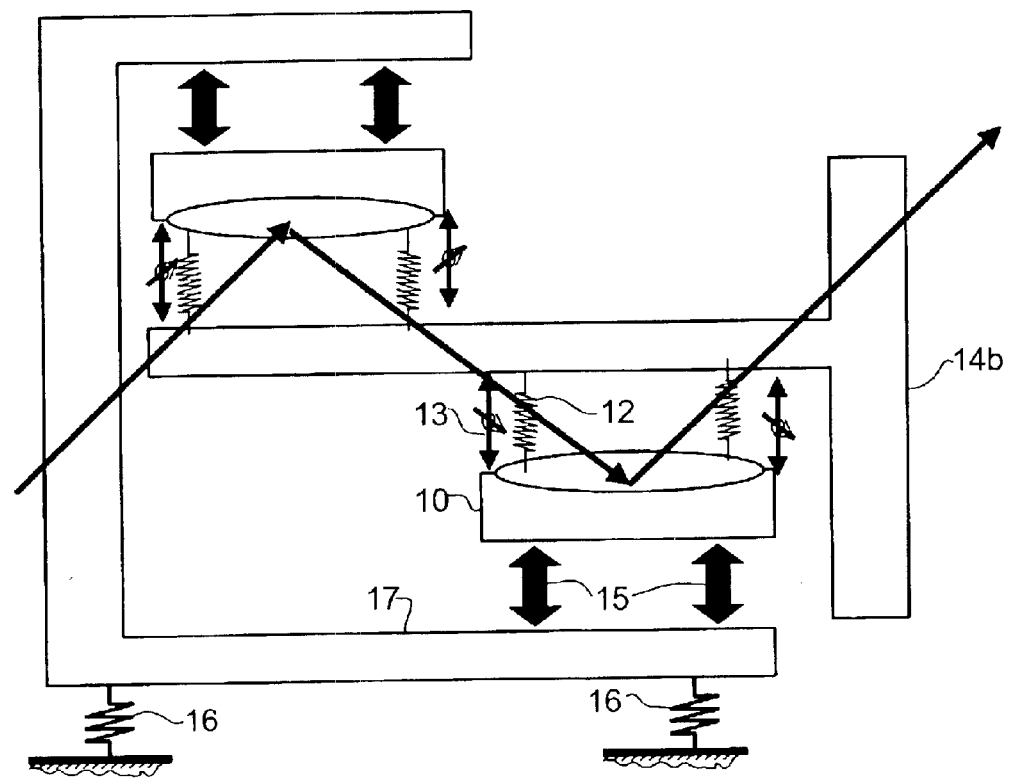
FIG. 6 depicts two optical elements mounted via a common frame acting as reaction mass to a projection system frame.

In the case of a projection system element being positioned in the manner described above in more than one degree of freedom, the reaction masses used with each actuator may be independent (as shown in FIGS. 3 and 4) or may be connected to form one or more combined reaction masses 14a, as shown in FIG. 5. Furthermore, the reaction masses of several or all optical elements can be combined into one body 14b, as shown in FIG. 6. The single body can then either be mounted on the projection system frame 17 or on the base plate BP.

The projection system sub-frame 11 shown in FIG. 2 may be a frame that is common to all optical elements within the projection system, but may also be a sub-frame to which one or more optical elements are mounted, the sub-frame 11 being mounted in some manner to the frame 17 of the projection system. Because of the reaction masses, the position loop of one optical element is not disturbed by the reaction forces of a position control loop of another optical element. Generally the common frame 17 of the projection system may be mounted on a frame of the lithographic apparatus, which is vibrationally isolated with respect to a base plate BP of the apparatus so as to constitute an isolated reference frame. The projection system frame may be mounted to the reference frame compliantly, as described in European Patent Application number 02254863.0.

FIG. 2 shows gravity compensators 12 mounted between optical element 10 and frame 11. In an alternative embodiment such gravity compensators 12 may be mounted between reaction mass 14 and optical element 10, although this is less efficient. However, the gravity compensators 12 might also be dispensed with. Actuators that do not act in the vertical direction will not experience a gravity force by the optical element 10 and do not require a gravity compensator at all. Any gravity compensation force should be arranged to act in line with the vertical control force to minimize bending moments that may result in a deformation of the optical surface.

An ideal one-degree of freedom reaction mass has a soft stiffness exactly in line with the direction of the reaction force (typically 2–20 Hz). A misalignment may result in an undesirable excitation of the optical system frame. The reaction mass can be made less sensitive for a misalignment of reaction forces if the other degree of freedoms are fitted with a "medium soft" suspension eigenfrequency. Usually this "medium stiffness" is 5 to 10 times higher as in the "soft" direction (typically 10–50 Hz).

In yet another variant of the first embodiment the reaction mass 14 is not softly mounted to the frame of the projection system, but to another frame of the lithographic apparatus, for instance base plate BP or the isolated reference frame onto which the frame 17 of the projection system is mounted.

Figure 7:
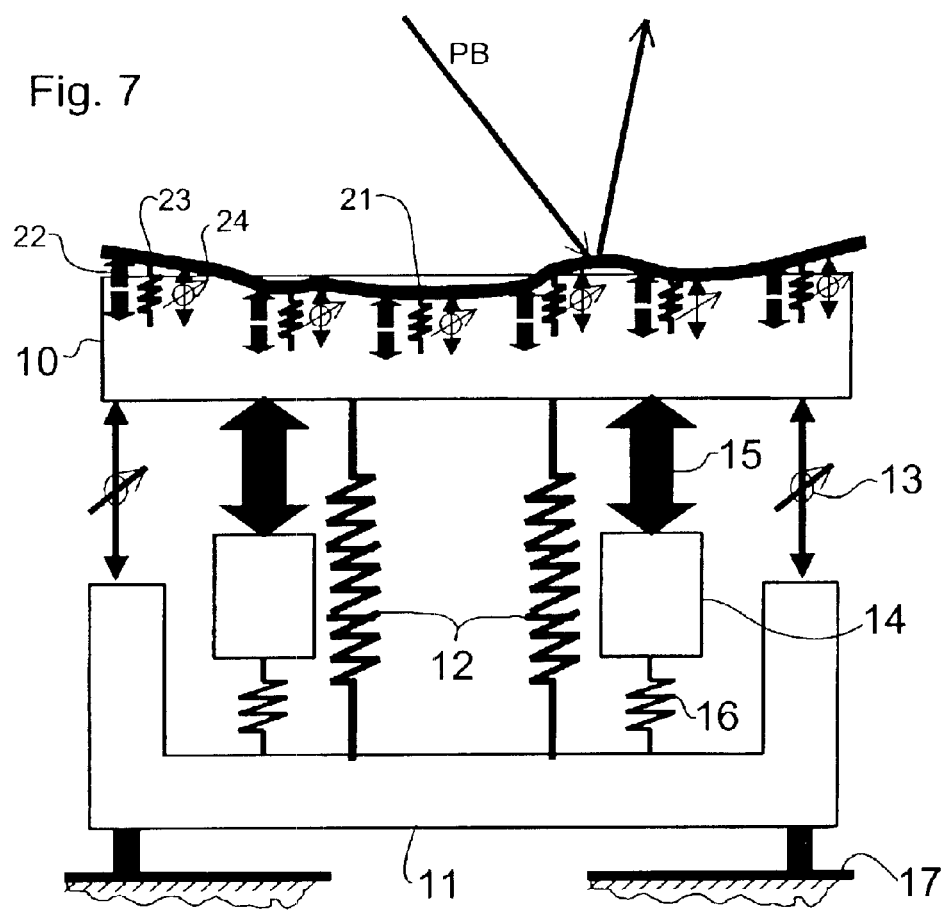
FIG. 7 depicts an optical element with an active controlled surface mounted via a sub-frame and two one-degree of freedom reaction masses to a projection system frame.

A further variant of the first embodiment is shown in FIG. 7. This variant incorporates an active mirror surface that can adjust for mirror surface imperfections. A thin and light (e.g. of mass 0.1 kg) reflective mirror surface 21 is placed on top of a thick support mirror structure 10 (e.g. of mass 1 to 10 or 30 kg), with multiple (e.g. from 9 to 64) small actuators 22, multiple sensors 24 and possibly multiple additional structural supports 23 in between. The structural supports 23 may comprise an array of burls.

The multiple actuators have very small stroke (e.g. <1 $\mu$m) and control the relative position of the mirror surface with respect to the mirror structure. The actuators could be of pneumatic, piezo-, electro-static, magneto-restrictive type. Using multiple actuators enables a local deformation of the surface and thus correction for local mirror surface imperfections. The large six-degree of freedom rigid body position (ca 1–1000 $\mu$m) is controlled with the Lorenz motors with reaction mass as is described above.

Because the total mass of the multiple surface actuators and flexible mirror is relatively small when compared to the mirror structure mass, the dynamics of the combination of the active surface and mirror structure can be designed to have high enough eigenfrequencies to enable both a global six-degree of freedom and a local surface sub-nanometer optical positioning with high servo bandwidth (e.g. 250–400 Hz). For a less accurate system, the 6 DOF Lorenz motors with reaction mass(es) may be replaced by other type of actuator or flexures.

The active mirror surface with multiple actuators enables a real time correction of the local mirror imperfections, resulting in less smeared and deformed images at wafer level.

Figure 8:
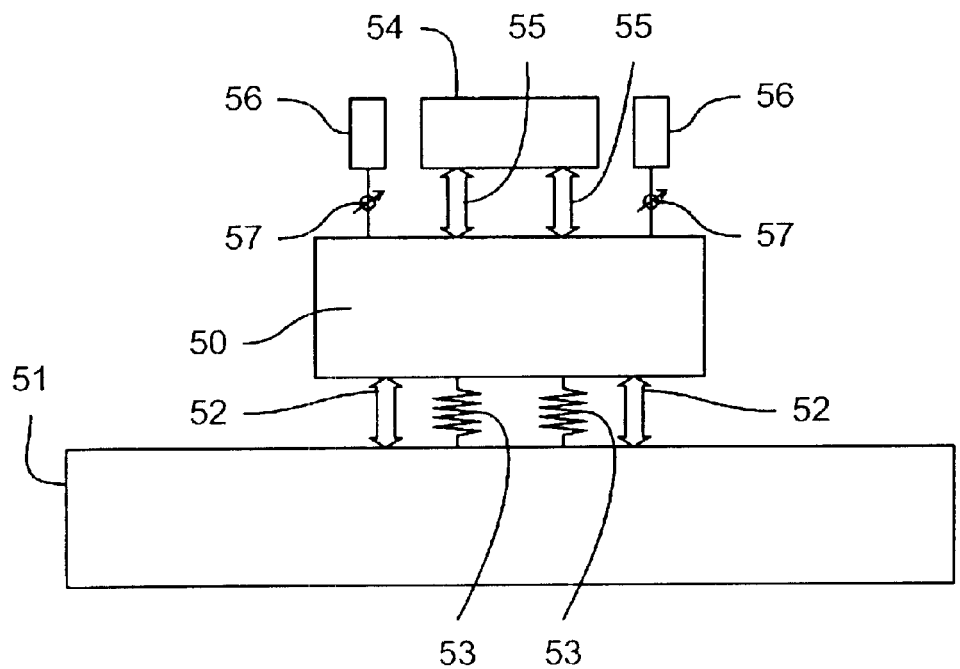
FIG. 8 depicts a mount, for mounting a projection system element on the projection system frame, used in a second embodiment of the present invention.

A second embodiment of the present invention is depicted in FIG. 8. A reaction mass 54 is used to "absorb" vibrations of the projection system element 50. The projection system element 50 is mounted on part of the projection system, such as the projection system frame 51, by actuators 52 (such as Lorenz-force motors, piezo-electric actuators, magnetorestrictive actuators, etc.) and, preferably, gravity compensators 53. The reaction mass 54 is attached to the projection system element 50 by means of actuators 55 but is not directly mechanically attached to the projection system. If, however, the reaction mass is the coil of an actuator, it may have connections directly to the projection system for utilities, such as power and cooling.

By controlling the actuators 55 appropriately, any undesired vibrations of the projection system element 50 may be attenuated. In order to detect vibrations of the projection system element 50, a second mass 56 is attached to the projection system element 50 by means of a sensor 57, such as a piezo-sensor or magneto-restrictive sensor for example, to form an accelerometer. The use of two sensors 57 and two actuators 55, as shown in FIG. 8, allows the measurement and attenuation of vibrations in both a linear first direction (vertically as shown in FIG. 8) and rotationally about a second direction, perpendicular to the first (about an axis perpendicular to the plane of FIG. 8).

It should be appreciated that the above arrangement can be applied to damp vibrations in both compliantly mounted optical elements and stiffly mounted, e.g. with an eigenfrequency of 400 Hz or more, optical elements.

Figure 9:
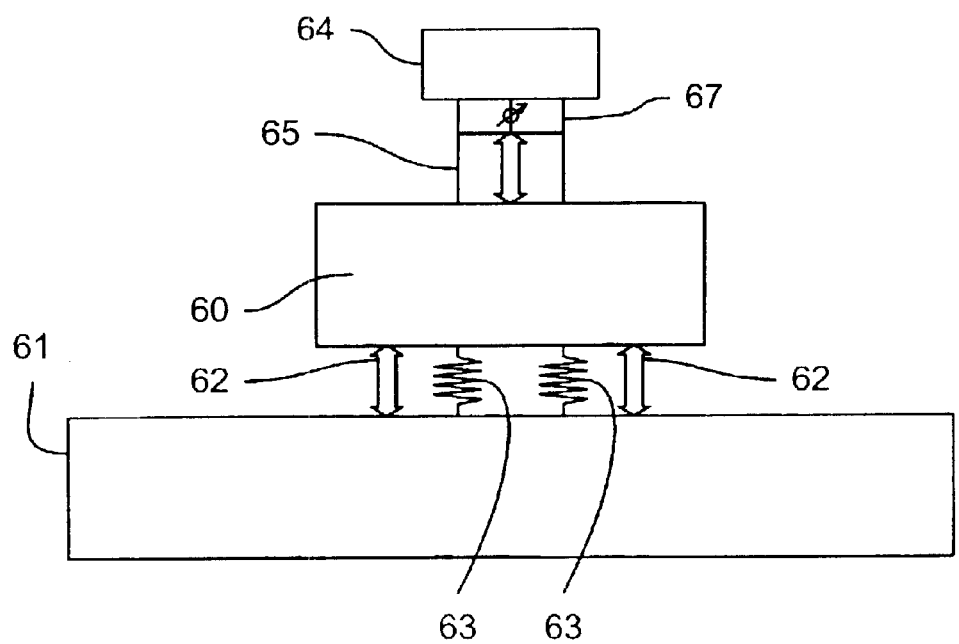
FIG. 9 depicts a variation of the mount shown in FIG. 8.

FIG. 9 shows an alternative arrangement of the projection system element mount shown in FIG. 8. As before, the projection system element 60 is mounted on the projection system frame 61, for example, by actuators 62 and gravity compensators 63. A reaction mass 64 is attached to the projection system element to attenuate unwanted vibrations. In this case, the sensor 67 and the actuator 65 are stacked and use a common mass 64. In this arrangement the actuator 65 is preferably a piezo-actuator and the sensor 67 is preferably a piezo-sensor. The sensor 67, located between the reaction mass 64 and the actuator 65, detects the vibration of the projection system element 60. The actuator 65 is then used to correct the movement of the projection system element to reduce the unwanted vibration. As in the arrangement shown in FIG. 8, a pair of sensors and actuators could be used to attenuate rotational vibrations as well as linear vibrations.

Although not shown in either FIG. 8 or FIG. 9, the vibrations of the projection system element will typically need to be controlled in six degrees of freedom. Appropriately modified combinations of reaction masses, sensors and actuators can be used to effect control of the degrees of freedom not shown. Where appropriate the reaction masses used and/or the masses used for the sensors may be combined to form one or more combined masses.

Although not shown in any of the Figures, the first and second embodiments may be combined to both reduce the vibrations transferred between the projection system frame and the projection system elements (using the arrangement shown in FIG. 3 or 4) and to attenuate any vibrations that do exist in the projection system element (using the arrangement shown in FIGS. 8 and 9).

Further, the projection system elements 10, 50, 60 are quite generally shown in the Figures. They may comprise refractive and reflective optical elements but also other types diffractive elements.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a projection beam of radiation;
   a support structure constructed and arranged to support a patterning device, the patterning device constructed and arranged to pattern the projection beam according to a desired pattern;
   a substrate table constructed and arranged to hold a substrate;
   a projection system constructed and arranged to project the patterned beam onto a target portion of the substrate, wherein at least one of the projection and radiation systems comprises at least one optical element connected by at least one actuator to at least one reaction mass that is moveable in at least one degree of freedom, the force exerted by the actuator between the reaction mass and the optical element being used to control the position of the optical element in one or more degrees of freedom.

2. A lithographic projection apparatus according to claim 1, further comprising a resilient member connecting the at least one reaction mass to a frame of the apparatus.

3. A lithographic projection apparatus according to claim 2, wherein the frame is a frame of the projection system.

4. A lithographic projection apparatus according to claim 2, wherein the frame is part of a base frame of the apparatus.

5. A lithographic projection apparatus according to claim 1, further comprising a sensor that determines the position of the at least one optical element and wherein the at least one actuator is responsive to the sensor such that the at least one optical element is adjusted to be in a required position.

6. A lithographic projection apparatus according to claim 1, wherein the at least one optical element is connected to a plurality of actuators each of which is connected to a respective reaction mass.

7. A lithographic projection apparatus according to claim 1, wherein the at least one optical element is connected to a plurality of actuators for exerting forces in different directions connected to a single reaction mass that is moveable in corresponding directions.

8. A lithographic projection apparatus according to claim 1, further comprising a plurality of optical elements, each with at least one actuator, the actuators of the plurality of optical elements being connected to a single reaction mass.

9. A lithographic projection apparatus according to claim 1, wherein the at least one optical element has an active controlled optical surface, the active optical surface having multiple local position control loops formed by multiple sensors and actuators that can correct for local reflective mirror imperfections.

10. A lithographic projection apparatus according to claim 1, wherein the at least one reaction mass is mechanically connected only to the least one optical element.

11. A lithographic projection apparatus according to claim 10, further comprising a sensor that detects the motion of the at least one optical element and wherein the at least one actuator is responsive to the sensor to adjust the position of the at least one optical element such that the motion of the at least one optical element is reduced.

12. A lithographic projection apparatus according to claim 1, wherein the projection system further comprises:
   a second reaction mass connected to the at least one optical element by a second actuator, wherein the reaction of the force exerted by the second actuator between the second reaction mass and the at least one optical element is used to adjust the position of the at least one optical element and the second reaction mass is mechanically connected only to the at least one optical element.

13. A lithographic projection apparatus according to claim 11, further comprising a second sensor that detects the motion of the optical element and wherein the at least one actuator is responsive to the second sensor to adjust the position of the at least one optical element such that the motion of the at least one optical element is reduced.

14. A lithographic projection apparatus according to claim 1, wherein the at least one actuator is a Lorenz-force motor.

15. A lithographic projection apparatus according to claim 1, wherein the at least one actuator is a piezo-actuator.

16. A device manufacturing method, comprising:
   providing a substrate that is at least partially covered by a layer of radiation-sensitive material;
   providing a projection beam of radiation using a radiation system;
   using a patterning device to endow the projection beam with a pattern in its cross-section;
   projecting the patterned beam of radiation onto a target portion of the layer of radiation-sensitive material using a projection system, wherein an actuator is connected between a reaction mass that is moveable in at least one degree of freedom and an optical element in at least one of the projection and radiation systems;
   using a force exerted by the actuator between the reaction mass and the optical element to control the position of the optical element.

* * * * *

UNITED STATES PATENT AND TRADEMARK OFFICE
CERTIFICATE OF CORRECTION

PATENT NO. : 6,788,386 B2  Page 1 of 1
APPLICATION NO. : 10/322,777
DATED : September 7, 2004
INVENTOR(S) : Hendrikus H. M. Cox et al.

It is certified that error appears in the above-identified patent and that said Letters Patent is hereby corrected as shown below:

On title page, item 56, insert:

-- FOREIGN PATENT DOCUMENTS

| | |
|---|---|
| EP0917004A2 | 05/1999 |
| EP1001512A2 | 05/2000 |
| DE1993889A1 | 03/2001 |
| EP1220012A2 | 07/2002 -- | and

Under "OTHER PUBLICATIONS", insert:

-- Uchida et al., "A Vertical X-Y Stage for X-Ray Lithography using SOR," *Bull. Japan Soc. Of Prec. Engg.*, June 1988, 22(2):102-108. --

Signed and Sealed this

Seventeenth Day of October, 2006

JON W. DUDAS
*Director of the United States Patent and Trademark Office*